United States Patent [19]

Kashiwagi

[11] Patent Number: 5,262,684
[45] Date of Patent: Nov. 16, 1993

[54] DRIVING CIRCUIT FOR HORIZONTAL OUTPUT CIRCUIT

[75] Inventor: Shigeru Kashiwagi, Noda, Japan

[73] Assignee: Victor Company of Japan, Ltd., Yokohama, Japan

[21] Appl. No.: 979,440

[22] Filed: Nov. 20, 1992

Related U.S. Application Data

[63] Continuation of Ser. No. 803,129, Dec. 5, 1991, abandoned.

[30] Foreign Application Priority Data

Dec. 10, 1990 [JP] Japan .................. 2-409803

[51] Int. Cl.⁵ .................. H03K 17/60; H03K 3/26
[52] U.S. Cl. .................. 307/270; 307/253; 307/300; 307/570
[58] Field of Search .............. 307/280, 571, 246, 270, 307/239, 300, 253, 570, 268, 630, 633, 261

[56] References Cited

U.S. PATENT DOCUMENTS

| 3,486,045 | 12/1969 | Frick | 307/253 |
| 3,641,371 | 2/1972 | Cartwright | 328/223 |
| 3,710,145 | 1/1973 | Williamson et al. | 307/253 |
| 3,846,646 | 11/1974 | Peters | 307/263 |
| 4,177,393 | 12/1979 | Förster | 307/300 |
| 4,491,744 | 1/1985 | Corey | 307/300 |

FOREIGN PATENT DOCUMENTS

| 0146479 | 6/1985 | European Pat. Off. . |
| 20474 | 1/1986 | Japan . |
| 190023 | 7/1989 | Japan . |
| 151765 | 6/1991 | Japan . |
| 2186138 | 8/1987 | United Kingdom . |
| 8504538 | 10/1985 | World Int. Prop. O. . |

OTHER PUBLICATIONS

EDN Electrical Design News, vol. 35, Jul. 21, 1990, pp. 270–271, Dvorak "Circuit kill storage delays".

Primary Examiner—William L. Sikes
Assistant Examiner—Toan Tran
Attorney, Agent, or Firm—Michael N. Meller

[57] ABSTRACT

A driving circuit for driving a horizontal output circuit provided with a transistor for performing ON-OFF switching operations, the transistor having a storage time, an OFF period and an ON period comprising a reactance element connected between an emitter and a base of the transistor, a power source for inducing an inverse base current in the transistor, and a switching element connected between the base of the transistor and the power source. The switching element causes the transistor ON-OFF by switching operations in such a way that the switching element becomes conductive during the storage time and the OFF period of the transistor, and becomes non-conductive during the ON period of the transistor, from which the storage time is excluded.

4 Claims, 4 Drawing Sheets

DRIVING CIRCUIT FOR HORIZONTAL OUTPUT CIRCUIT

This application is a continuation of application Ser. No. 07/803,129, filed Dec. 5, 1991 now abandoned.

BACKGROUND OF THE INVENTION

1. Field of the Invention

The present invention relates to a transistor horizontal output driving circuit and more particulalry to a driving circuit suitable especially for a horizontal output circuit in a display unit using a cathode ray tube (CRT) that deals with a high horizontal deflection frequency, a power supply circuit and the like.

2. Description of the Related Art

FIG. 1 is a circuit diagram showing a horizontal deflecting circuit using a prior art horizontal output driving circuit. The circuit is comprised of a horizontal oscillating circuit 1 for outputting oscillating waveform Vosc synchronized to a horizontal synchronizing pulse P supplied from the preceding stage (not shown), the prior art horizontal output driving circuit 2, a horizontal output transistor 3, a damper diode 4, a flyback resonance capacitor 5, a horizontal deflection coil 6, an S-shape correcting capacitor 7 and a horizontal output transformer 8 (or a flyback transformer). The horizontal output driving circuit 2 is further comprised of a horizontal exciting transistor 9, a base input resistor 10 for the horizontal exciting transistor 9, a damping resistor 11, a damping capacitor 12, a horizontal exciting transformer 13, a current limiting resistor 14 and a base resistor 15 for the horizontal output transistor 3.

The horizontal deflecting circuit arranged as described above is often found in normal television receivers and the like and from its well-known principle, a half-sine horizontal flyback pulse Vc is generated at a collector of the horizontal output transistor 3 and sawtooth wave current Iy having horizontal deflection frequency synchronized with incoming synchronizing signal flows in the horizontal deflection coil 6. Because the horizontal deflection coil 6 is mounted on a neck portion (not shown) of the CRT, it can deflect electron beam in the CRT in the horizontal direction by the sawtooth wave current Iy.

When the circuit shown in the figure is used exclusively as a horizontal deflection circuit, the unit 8 works as a horizontal output transformer and a power is supplied to the circuit from a first DC power source $+E_B$ (DC voltage $+E_B$) through a primary coil 8a of the transformer 8. When the circuit shown in the figure is used both as a horizontal deflecting circuit and a high voltage generating circuit, the unit 8 works as a flyback transformer, by which the horizontal flyback pulse Vc is boosted or stepped up at the side of a secondary coil 8b to produce a pulse Vhv. The pulse Vhv is then reflected to a high DC voltage to be supplied to the anode of the CRT to operate it.

Operations of the horizontal output driving circuit 2 and the horizontal output transistor 3 will then be explained.

When the horizontal oscillating waveform Vosc outputted from the horizontal oscillating circuit 1 is supplied to one end of the base resistor 10 through a terminal T, the horizontal exciting transistor 9 becomes ON i.e. conductive during this Vosc is in the high-level and exciting waveform Vdc is generated at its collector. The damping resistor 11 and the capacitor 12 are provided to prevent overshoot of the exciting waveform Vdc when the horizontal exciting transistor 9 is cut off. One end of a primary coil 13a of the horizontal exciting transformer 13 is connected to the DC power source $+E_B$ through the current limiting resistor 14.

A waveform having the same polarity with the exciting waveform Vcd is obtained in a secondary coil 13b of the horizontal exciting transformer 13. This waveform causes a base current Ib to the horizontal output transistor 3 through the base resistor 15. This base current Ib causes the horizontal output transistor 3 to perform ON-OFF switching operation and the switching of the horizontal output transistor 3 causes the circuit shown in FIG. 1 to work as a horizontal deflecting circuit as a whole.

FIG. 2 is an explanatory drawing of circuit operations of the horizontal deflecting circuit. When the output Vosc of the horizontal oscillating circuit 1 shown in FIG. 2A is supplied to the horizontal exciting transistor 9, the horizontal exciting transistor 9 becomes ON during the high-level period of Vosc plus storage time tsd which is determined by a characteristic inherent to the horizontal exciting transistor 9. As a result, waveform Vcd generated at the collector of the horizontal exciting transistor 9 becomes rectangular waveform as shown in FIG. 2B.

During a high-level period of the waveform Vcd, a voltage at one end of secondary coil 13b of the horizontal exciting transformer 13 connected to the base resistor 15, becomes positive. Then during the high-level period of the waveform Vcd, the base current Ib of the horizontal output transistor 3 flows in the positive direction as shown in FIG. 2C and turns the horizontal output transistor 3 to ON state making it conductive between its collector and emitter.

The base current Ib does not become zero-level suddenly even when the voltage waveform Vcd shown in FIG. 2B turns into bottoming state, but overshoots to go negative direction with respect to the zero-level, then goes positive direction to become zero when the storage time tso of the horizontal output transistor 3 ends, as shown in FIG. 2C. The ON state of the horizontal output transistor 3 continues until the storage time tso ends. Accordingly, collector current Ic of the horizontal output transistor 3 continues to flow until the end point of the storage time tso as shown by solid line in FIG. 2D.

When the storage time tso ends and the collector current Ic becomes zero, a half-sine flyback resonant pulse Vc as shown in FIG. 2E is generated at the collector. When this pulse Vc returns to zero-level, damper current Id automatically starts to flow as shown by dashed line in FIG. 2D and smoothly links with the collector current Ic. As a result, current Iy that flows in the horizontal deflection coil 6 becomes sawtooth wave in which the collector current Ic, the damper current Id and a current (not shown) that flows in the flyback resonant capacitor 5 are combined (see FIG. 2F). This sawtooth wave Iy deflects the electron beam of the CRT in the horizontal direction.

The horizontal deflecting circuit arranged as shown in FIG. 1 performs satisfactory provided that the horizontal deflection frequency is low e.g. 15.73 kHz for normal TV broadcasting receivers.

However in image display units used lately for CAD and the like, horizontal deflection frequency becomes increased to such as 84 kHz, 97 kHz and 128 kHz as a design trend to meet the demand for increasing definition of images. When such a horizontal deflection frequency is increased (when the horizontal deflection period th is shortened) like that, value of the storage time tso aforementioned becomes critical. For example, when a horizontal deflection frequency is 100 kHz, i.e. a horizontal deflection period th is about 10 μs, because the storage time tso of a horizontal output transistor is generally about 4 to 5 μs, the storage time tso becomes about half of the horizontal deflection period th and the operations as shown in FIG. 2 cannot be performed. Therefore, in order to deal with such a high horizontal deflection frequency, the storage time tso has to be shortened as small as possible.

In order to reduce the storage time tso, one method is known, in which an inverse base current Ibn shown in FIG. 2C is increased to sweep excessive carriers in the base layer of the transistor 3. That is, as shown in FIG. 3, when the absolute value of the inverse base current is increased from Ibn1 to Ibn2, the storage time tso is shortened from tso1 to tso2.

However, it is difficult to increase the value of the inverse base current alone in the prior art shown in FIG. 1. For example, the inverse base current Ibn may be increased when the winding ratio of the horizontal exciting transformer 13 is increased, but base current Ibp in the forward direction also increases in the same time. If the base current Ibp in the forward direction increases, supersaturation state develops in proportion and causes the storage time tso to be prolonged.

An existence of a leakage inductance of the secondary coil 13b of the horizontal exciting transformer 13 is also a problem. The leakage inductance reduces the waveform inclination of the inverse current Ibn and prolongs the time for sweeping all the excessive carriers, i.e. the storage time tso.

Then, a means for forcibly inducing the inverse base current Ibn, is required regardless of the design of the horizontal exciting transformer 13 in a horizontal deflecting circuit used in a high definition display unit that deals with high horizontal deflection frequencies.

Fig. 4 is a circuit diagram showing a main part of horizontal output driving circuit in which a means for forcibly inducing inverse base current Ibn is provided. This is disclosed in the Japanese Laid-open Patent Application No. 61-20474/1986 which the present applicant applied. In this circuit, a second base resistor 16, an Ibn inducing circuit 17, a timing circuit 18 and a second DC power source −E are newly added. The Ibn inducing circuit 17 is a type of gate circuit which becomes conductive during the period of the aforementioned storage time tso and causes the inverse base current Ibn flowing to the DC power source −E through the resistor 16. The timing circuit 18 outputs a rectangular wave Vdn having horizontal deflection period and determines a timing of gate operation of the Ibn inducing circuit 17.

Such circuit arrangement allows to flow an enough inverse base current Ibn with the negative power source −E and to shorten the storage time tso.

However, the circuit shown in FIG. 4 had a problem that the circuit configuration becomes complex and larger in proportion to the means provided for forcibly inducing the inverse base current Ibn.

Moreover, in both circuits shown in FIGS. 1 and 4, the horizontal exciting transformer 13 within the horizontal output driving circuit 2 performing the switching operation with the high frequency rectangular wave, causes a significant amount of power loss in its core unless an expensive core material having excellent high frequency characteristics is used.

Furthermore, a current is abruptly interrupted in the primary coil 13a of the horizontal exciting transformer 13, so that transient develops in the primary side voltage waveform Vcd. If a peak value of the transient exceeds the maximum allowable voltage of the collector of the horizontal exciting transistor 9, it will damage the horizontal exciting transistor 9. Therefore, a damping circuit comprised of the resistor 11 and the capacitor 12 is required. However, there has been a problem associated with the provision of the damping circuit which introduces a loss at the resistor 11 and a slow rise of the voltage waveform Vcd. The latter increases a collector loss of the horizontal exciting transistor 9, accordingly the efficiency of the circuit as a whole is lowered.

It is, therefore, an object of the present invention to provide a horizontal output driving circuit that allows to shorten the storage time tso of the transistor serving as a switching device so that its switching speed is improved, by a simple circuit arrangement without sacrificing the efficiency of the horizontal output circuit.

Another object of the present invention is to provide a horizontal output driving circuit that is suitable for a horizontal deflecting circuit that deals with a high horizontal deflection frequency and for a power circuit that performs a high speed switching.

SUMMARY OF THE INVENTION

In order to achieve the aforementioned goals, a driving circuit for driving a horizontal output circuit provided with the transistor having a storage time, an OFF period and an ON period, for performing ON-OFF switching operations, is comprised of a reactance device connected between an emitter and a base of the transistor, a power source for inducing an inverse base current in the transistor, and a switching device connected between the base of the transistor and the power source. The switching device causes the transistor ON-OFF switching operations in such a way that the switching device becomes conductive during the storage time and the OFF period of the transistor, and becomes non-conductive during the ON period of the transistor, from which the storage time is excluded.

In the driving circuit, the reactance device may be an inductor and the switching device has a terminal for receiving a driving input signal and a semiconductor switching element which is controlled by the driving input signal.

DETAILED DESCRIPTION OF PREFERRED EMBODIMENTS

Referred now to the drawings, preferred embodiments of the present invention will be explained.

Figure 1:
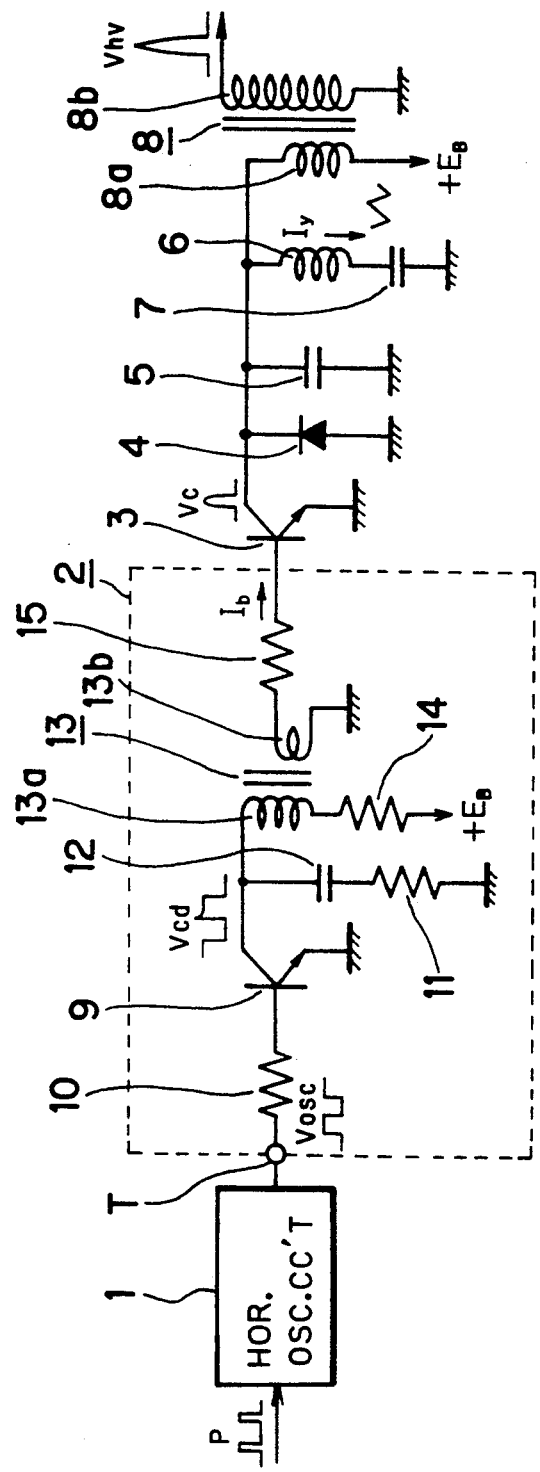
FIG. 1 is a circuit diagram illustrating a horizontal deflecting circuit using a prior art horizontal output driving circuit.
Figure 5:
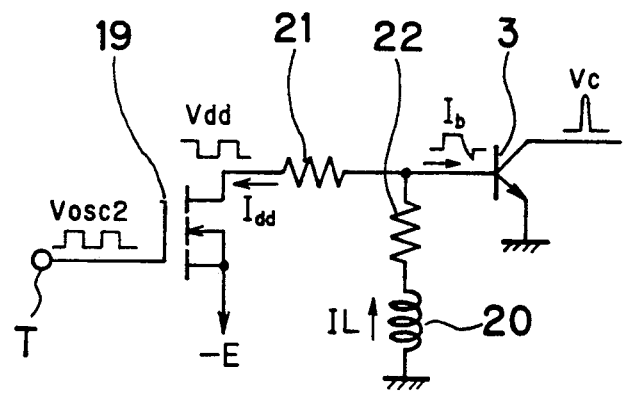
FIG. 5 is a circuit diagram illustrating a first embodiment of the present invention.

FIG. 5 is a circuit diagram illustrating a first embodiment of the present invention. A horizontal deflecting circuit can be realized by replacing the prior art horizontal driving circuit 2 enclosed by dashed line in FIG. 1 with this circuit.

In FIG. 5, the circuit is comprised of a MOS type field effect transistor (hereinafter referred to as "MOSFET") 19 which is an exciting switching element, a flywheel coil 20, a first current limiting resistor 21, a second current limiting resistor 22, a horizontal output transistor 3 which is the same one as in the prior art and a DC power source $-E$ having negative polarity with respect to the emitter of the transistor 3 for inducing inverse base current of the horizontal output transistor 3.

As seen in FIG. 5, the emitter of the horizontal output transistor 3 is grounded and its base is grounded through the second current limiting resistor 22 and the flywheel coil 20 connected in series. The base is also connected to the drain of the MOSFET 19 through the first current limiting resistor 21. The source of the MOSFET 19 is connected to the DC power source $-E$.

Figure 6:
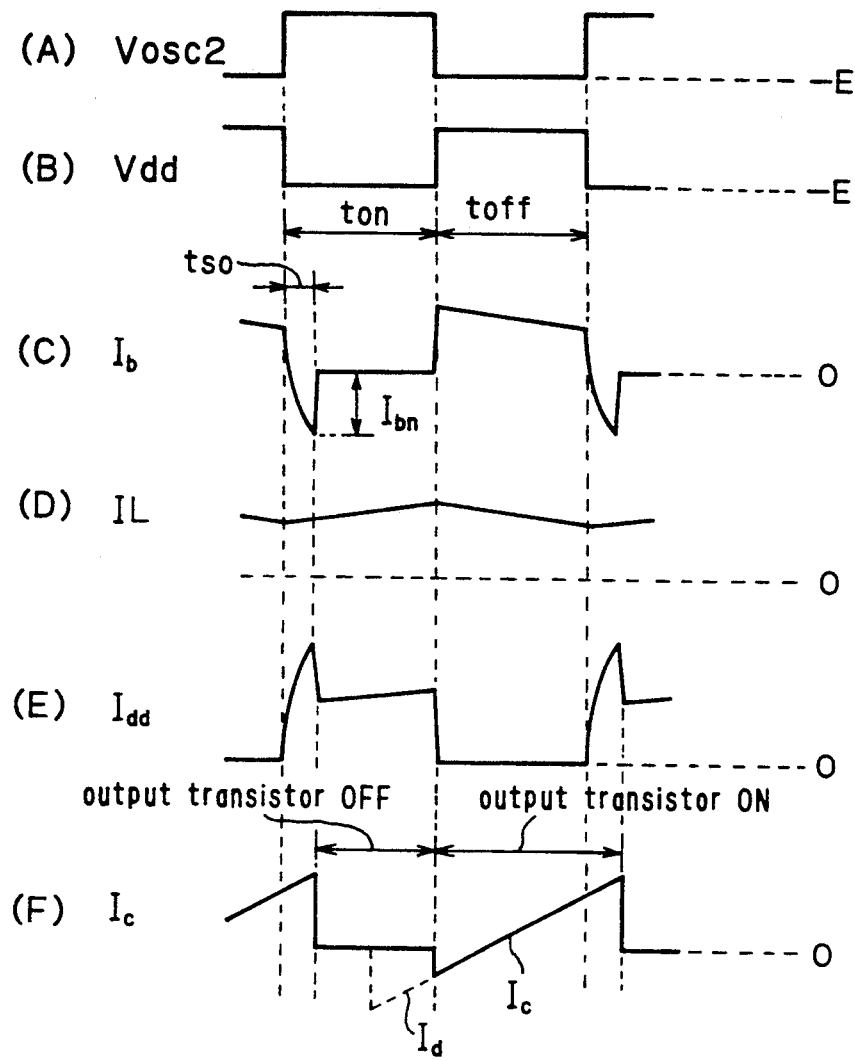
FIG. 6 is an explanatory drawing showing operations of the first embodiment.

Referring now to FIG. 6, operations of the circuit will be explained. FIG. 6A is a waveform chart of a rectangular wave Vosc2 supplied to the gate of the MOSFET 19 through a terminal T. Though this rectangular wave Vosc2 more or less differs from the oscillating waveform Vosc in terms of its pulse width and voltage level, it is virtually same as the rectangular wave synchronized to the horizontal synchronizing signal P and can be generated by the same horizontal oscillating circuit as in the prior art.

Voltage value of the rectangular wave Vosc2 in the high-level period is larger than that of a source voltage of the MOSFET 19 (here the voltage value is $-E$) in the positive direction, so that the MOSFET 19 turns into ON state between its drain and source during this high-level period. Accordingly, drain volgage waveform Vdd of the MOSFET 19 becomes like that as shown in FIG. 6B where the MOSFET 19 is ON i.e. conductive state during the period ton, so that the drain voltage bottoms on $-E$ during that period.

Inverse base current Ibn flows out of the base of the horizontal output transistor 3 in the initial period ton and flows into the DC power source $-E$ through the first current limiting resistor 21 and the MOSFET 19. In the same time, current IL flows into the DC power source $-E$ from the flywheel coil 20 and the second current limiting resistor 22 through the first current limiting resistor 21 and the MOSFET 19.

At this time, the waveform of base current Ib of the horizontal output transistor 3 becomes as shown in FIG. 6C. When the storage time tso of the horizontal output transistor 3 ends and excessive carriers within the base layer are swept away, the current value of the base current Ib becomes zero. However, the current IL that flows in the flywheel coil 20 continues to flow as shown in FIG. 6D during the period ton when the MOSFET 19 is ON state.

Next, the rectangular wave Vosc2 turns to a low-level period toff causing the MOSFET 19 turned into OFF state. The current IL that flows from the flywheel coil 20 continues to flow into the base of the horizontal output transistor 3 as a forward direction base current Ibp even when the MOSFET 19 is OFF state. During the period toff, therefore, the current value of the base current Ib and that of the IL that flows from the flywheel coil 20 almost coincide each other and waveforms of the current Ib and the current IL become as shown in FIG. 6C and 6D, respectively.

As a result, the waveform of drain current Idd that flows in the MOSFET 19 becomes as shown in FIG. 6E. Combined current of the drain current Idd and the base current Ib becomes the flywheel coil current IL.

The first current limiting resistor 21 adjusts the inverse base current Ibn and the forward direction base current Ibp and the second current limiting resistor 22 adjusts mainly values of the forward direction base current Ibp.

This results that, as shown in FIG. 6F, the MOSFET 19 turns into ON state during the period ton which corresponds to the storage time tso plus a subsequent OFF period of the horizontal output transistor 3, then turns into OFF state during the period toff which corresponds to an ON period of the horizontal output transistor 3 from which the storage time tso is excluded. ON-OFF operation of the horizontal output transistor 3 is caused accordingly with the above operation of the MOSFET 19.

Figure 2:
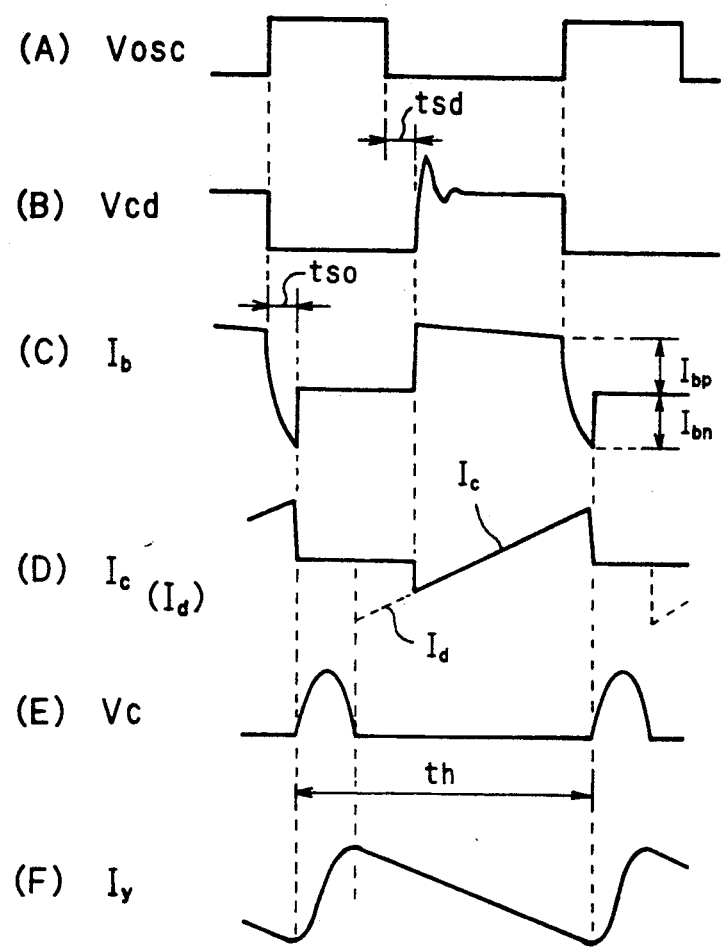
FIG. 2 is an explanatory drawing showing operations of the prior art horizontal deflecting circuit shown in FIG. 1.
Figure 3:
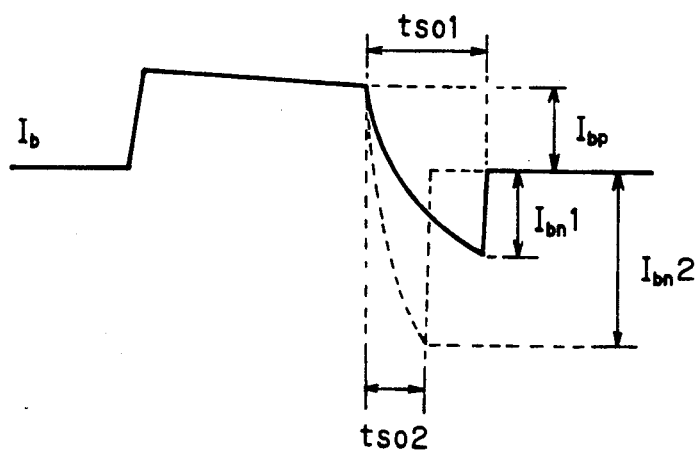
FIG. 3 is an explanatory drawing showing operation of the prior art horizontal deflecting circuit shown in FIG. 1.
Figure 4:
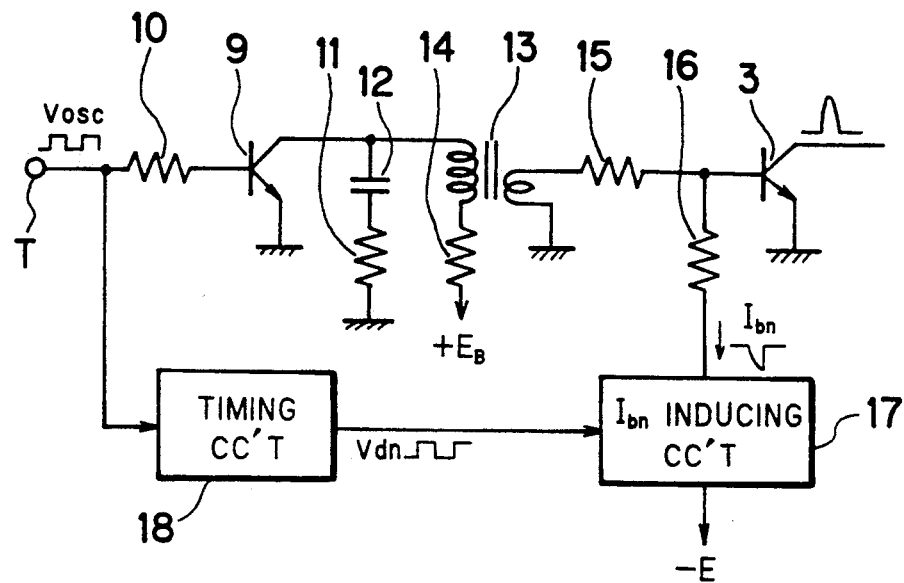
FIG. 4 is a circuit diagram showing a main part of another prior art horizontal output driving circuit in which a means for forcibly inducing an inverse base current is provided.

As seen in FIG. 6C, the base current Ib of the horizontal output transistor 3 in this embodiment has the same waveform as that of the base current Ib in the prior art example (see FIG. 2C). Accordingly, the present embodiment can be used as a horizontal output driving circuit for a horizontal output circuit. Moreover, the present embodiment has various excellent effects which cannot be seen in the prior art example, as follows:

a) At first, no inductance component as in the prior art circuit (inductance component of the horizontal exciting transformer 13) is inclined in the path for flowing the inverse base current Ibn of the horizontal output transistor 3. Therefore, the increase of the storage time tso due to the lessened inclination of the waveform of the inverse base current Ibn, does not take place. Moreover, the current value of the inverse base current Ibn can be freely determined as a design option by the values of the DC power source $-E$ and the first current limiting resistor 21. Accordingly, the value of the inverse base current Ibn can adequately be large in contrast to the forward direction base current Ibp, so that the storage time tso can be shortened and the switching speed of the horizontal output transistor 3 can be improved.

b) The current IL that flows in the flywheel coil 20 is almost a direct current as shown in FIG. 6D, so that the winding and core of the coil are less restricted. And that there is no abrupt change in the current IL which means to transient voltage generated and therefore, no damping circuit as in the prior art example is required. Accordingly, no loss due to the otherwise provided damping circuit develops. Moreover, there is no overshoot of the transient voltage generated by the flywheel coil 20, this allows the MOSFET 19 having a low maximum ratings, and On resistance of the MOSFET 19 can be reduced. Accordingly, the loss can be reduced also here and the efficiency of the overall deflecting circuit can be improved.

c) As seen from FIG. 5, the present embodiment allows a considerably simplified circuit structure compared to the horizontal output driving circuit 2 which is a prior art driving circuit. Accordingly, the use of the driving circuit of this embodiment utilizes a miniature and lightweight horizontal deflecting circuit.

d) The flywheel coil 20 is not a transformer but a single coil, which is advantageous in size and cost compared to the horizontal exciting transformer 13 in the prior art example.

Although the embodiment using MOSFET as an exciting switching element has been explained so far, the exciting switching element is not confined only to MOSFET. The exciting switching element may be any element such as a normal bi-polar transistor, so long as its storage time is minimal as MOSFET.

Figure 7:
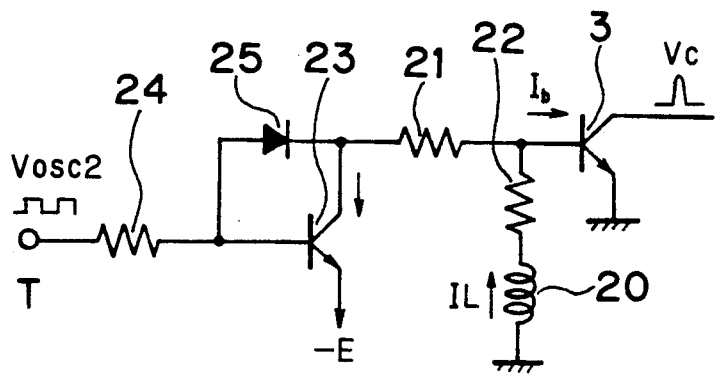
FIG. 7 is a circuit diagram illustrating a second embodiment of the present invention.

FIG. 7 shows a second embodiment using an element other than MOSFET for the exciting switching element. The like reference characters and numerals with those in the first embodiment designate like parts, wherein the numeral 23 denotes an npn-type transistor as the exciting switching element, 24 its base resistor and 25 clamp diode.

When the aforementioned rectangular wave Vosc2 is supplied to one end of the base resistor 24 through the terminal T, the transistor 23 performs switching operations and a base current as shown in FIG. 6C flows in the base of the horizontal output transistor 3 in the same way as in the first embodiment.

The diode 25 which is connected between the collector and the base of the transistor 23 is a known circuit which works as a clamp diode for minimizing the storage time of the transistor 23.

Voltage generated at the collector of the transistor 23 is small voltage having no transient as same as that in the first embodiment. Accordingly, a Schotty barrier diode having a low maximum voltage rating and a low forward voltage may be used for the diode 25. Therefore, a clamp operation by the diode 25 may be carried out securely and the storage time of the transistor 23 can adequately be short.

Thus, the horizontal output driving circuit of the present invention is suitable for a horizontal output circuit dealing with a high horizontal deflection frequency. Moreover, the horizontal output driving circuit that performs such switching operations may be widely applied to various circuits for performing high-speed switching, such as switching circuit of a main switching transistor in switching regulators.

As described above, the horizontal output driving circuit that performs such switching operations of the present invention allows to shorten practically the storage time of the transistor which is a switching element and to improve its switching speed by a simple circuit arrangement without sacrificing the efficiency of the circuit as a whole. Accordingly, the use of the circuit that performs such switching operations allows to fully improve the performance, to miniaturize and lighten and to reduce the cost of such circuits as a horizontal output circuit that deals with a high horizontal deflection frequency and a power circuit that performs high-speed switching.

What is claimed is:

1. A driving circuit for driving a horizontal output circuit provided with a transistor for performing periodic ON-OFF switching operations, said transistor having an emitter connected to a ground, a storage time, a base, an OFF period and an ON period, comprising:
    a single independent flywheel coil connected between said base and said ground;
    a power source for inducing an inverse base current in said transistor;
    a switching element connected between said base of said transistor and said power source and being operable alternately between an ON state and an OFF state responsive to an input signal of rectangular wave supplied to said driving circuit, during said ON state, a current flowing continuously from said ground to said power source through said single independent flywheel coil and said switching element, and during said OFF state, said current flowing continuously from said ground to said base of said transistor; and
    said switching element causing said transistor periodic ON-OFF switching operations in such a way that said switching element becomes said ON state during said storage time and said OFF period of said transistor, and becomes said OFF state during said ON period of said transistor where said storage time is excluded from said ON period.

2. A driving circuit for driving a horizontal output circuit provided with a transistor for performing ON-OFF switching operations, said transistor having an emitter connected directly to a ground, a storage time, a base, an OFF period and an ON period, comprising:
    a single independent flywheel coil connected between said base and said ground;
    a power source for inducing an inverse base current in said transistor;
    a switching element connected between said base of said transistor and said power source and being operable alternately between an ON state and an OFF state responsive to an input signal of rectangular wave supplied to said driving circuit, during said ON state, a current flowing continuously from said ground to said power source through said single independent flywheel coil and said switching element, and during said OFF state, said current flowing continuously from said ground to said base of said transistor; and
    said switching element driving said transistor causing a base current flowing into said base of said transistor when said switching element becomes said OFF state, said switching element further causing said inverse base current flowing from said base of said transistor to said power source through said switching element when said switching element becomes said ON state, resulting in periodic ON-OFF switching operations of said transistor in such a relation that said switching element becomes said ON state during said storage time and said OFF period of said transistor, and becomes said OFF state during said ON period of said transistor where said storage time is excluded from said ON period.

3. A driving circuit for driving a horizontal output circuit provided with a transistor for performing periodic ON-OFF switching operations, said transistor having an emitter connected directly to a ground, a storage time, a base, an OFF period and an ON period, comprising:
    impedance means connected to a base of said transistor forming a single signal path therebetween, said terminal means receiving an input signal of rectangular wave, said input signal being transmitted through said single signal path to drive said transistor;

a single independent flywheel coil connected between said base and said ground;

a power source for inducing an inverse base current in said transistor; and a switching element connected between said base of said transistor and said power source and being operable alternately between a conductive state and a non-conductive state in response to said input signal of rectangular wave supplied to said driving circuit, during said conductive state, a current flowing continuously from said ground to said power source through said single independent flywheel coil and said switching element, and during said non-conductive state, said current flowing continuously from said ground to said base of said transistor, said. Impedance means being inserted between said base of said transistor and said switching means, and said switching element causing said transistor periodic ON-OFF switching operations in such a way that said switching element becomes said conductive state during said storage time and said OFF period of said transistor, and becomes said non-conductive state during said ON period of said transistor where said storage time is excluded from said ON period.

4. A driving circuit according to claim 1, further comprising a resistor, one end of which is connected to the base of said transistor and said switching element is directly coupled between said power source and another end of said resistor.

* * * * *